US012046479B2

(12) United States Patent
Chiu et al.

(10) Patent No.: US 12,046,479 B2
(45) Date of Patent: Jul. 23, 2024

(54) NITRIDE-CONTAINING STI LINER FOR SiGe CHANNEL

(71) Applicant: Taiwan Semiconductor Manufacturing Company, Ltd., Hsinchu (TW)

(72) Inventors: Ya-Wen Chiu, Tainan (TW); Szu-Ying Chen, Hsinchu (TW); Lun-Kuang Tan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 63 days.

(21) Appl. No.: 17/339,007

(22) Filed: Jun. 4, 2021

(65) Prior Publication Data

US 2022/0051906 A1 Feb. 17, 2022

Related U.S. Application Data

(60) Provisional application No. 63/072,808, filed on Aug. 31, 2020, provisional application No. 63/065,084, filed on Aug. 13, 2020.

(51) Int. Cl.
*H01L 21/324* (2006.01)
*H01L 21/02* (2006.01)
(Continued)

(52) U.S. Cl.
CPC .... *H01L 21/3247* (2013.01); *H01L 21/02164* (2013.01); *H01L 21/0217* (2013.01); *H01L 21/02532* (2013.01); *H01L 21/02639* (2013.01); *H01L 21/30604* (2013.01); *H01L 21/76224* (2013.01); *H01L 21/823807* (2013.01); *H01L 21/823821* (2013.01);
(Continued)

(58) Field of Classification Search
CPC ......... H01L 21/02247; H01L 21/02249; H01L 21/02329–02332; H01L 29/7851–7854
See application file for complete search history.

(56) References Cited

U.S. PATENT DOCUMENTS 7,425,740 B2 9/2008 Liu et al.
7,667,271 B2 2/2010 Yu et al.
(Continued)

FOREIGN PATENT DOCUMENTS

| TW | 202008428 A | 2/2020 |
| TW | 202018785 A | 5/2020 |
| TW | 202020978 A | 6/2020 |

OTHER PUBLICATIONS

Chiu, Ya-Wen, et al., "Method of Manufacturing a Semiconductor Device and a Semiconductor Device", U.S. Appl. No. 17/109,895, filed Dec. 20, 2020, Assignee: Taiwan Semiconductor Manufacturing Co., Ltd., Specification and Drawings, 49 pages.

*Primary Examiner* — Brian Turner
(74) *Attorney, Agent, or Firm* — HAYNES AND BOONE, LLP

(57) ABSTRACT

A semiconductor device includes a fin structure that protrudes vertically out of a substrate, wherein the fin structure contains silicon germanium (SiGe). An epi-silicon layer is disposed on a sidewall of the fin structure. The epi-silicon layer contains nitrogen. One or more dielectric liner layers are disposed on the epi-silicon layer. A dielectric isolation structure is disposed over the one or more dielectric liner layers.

20 Claims, 14 Drawing Sheets

(51) Int. Cl.
*H01L 21/306* (2006.01)
*H01L 21/762* (2006.01)
*H01L 21/8238* (2006.01)
*H01L 27/092* (2006.01)
*H01L 29/06* (2006.01)
*H01L 29/161* (2006.01)
*H01L 29/423* (2006.01)
*H01L 29/66* (2006.01)
*H01L 29/78* (2006.01)
*H01L 29/786* (2006.01)
*H10B 10/00* (2023.01)

(52) U.S. Cl.
CPC .... *H01L 21/823878* (2013.01); *H01L 27/092* (2013.01); *H01L 29/0665* (2013.01); *H01L 29/161* (2013.01); *H01L 29/42392* (2013.01); *H01L 29/66742* (2013.01); *H01L 29/66795* (2013.01); *H01L 29/7851* (2013.01); *H01L 29/78696* (2013.01); *H10B 10/12* (2023.02)

(56) References Cited

U.S. PATENT DOCUMENTS

| | | | |
|---|---|---|---|
| 7,910,453 B2 | 3/2011 | Xu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,703,565 B2 | 4/2014 | Chang et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,742,509 B2 | 6/2014 | Lee et al. | |
| 8,772,109 B2 | 7/2014 | Colinge | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,887,106 B2 | 11/2014 | Ho et al. | |
| 9,984,933 B1* | 5/2018 | Xu | H01L 21/845 |
| 2002/0163026 A1* | 11/2002 | Park | H01L 28/91 |
| | | | 257/E21.01 |
| 2005/0019993 A1* | 1/2005 | Lee | H01L 29/66795 |
| | | | 438/157 |
| 2011/0068407 A1 | 3/2011 | Yeh et al. | |
| 2013/0011983 A1 | 1/2013 | Tsai et al. | |
| 2013/0285153 A1 | 10/2013 | Lee et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0183600 A1 | 7/2014 | Huang et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2014/0367795 A1* | 12/2014 | Cai | H01L 29/7851 |
| | | | 438/275 |
| 2015/0115397 A1* | 4/2015 | Cheng | H01L 21/3065 |
| | | | 438/437 |
| 2015/0270337 A1* | 9/2015 | Ujihara | H01L 29/0649 |
| | | | 257/510 |
| 2016/0329247 A1* | 11/2016 | Wang | H01L 24/13 |
| 2017/0373063 A1* | 12/2017 | Bao | H01L 21/823814 |
| 2018/0151688 A1* | 5/2018 | Ching | H01L 21/02271 |
| 2019/0319113 A1* | 10/2019 | Yu | H01L 21/28123 |
| 2019/0378844 A1* | 12/2019 | Chen | H01L 27/10897 |
| 2020/0051985 A1* | 2/2020 | Su | H01L 29/0649 |

* cited by examiner

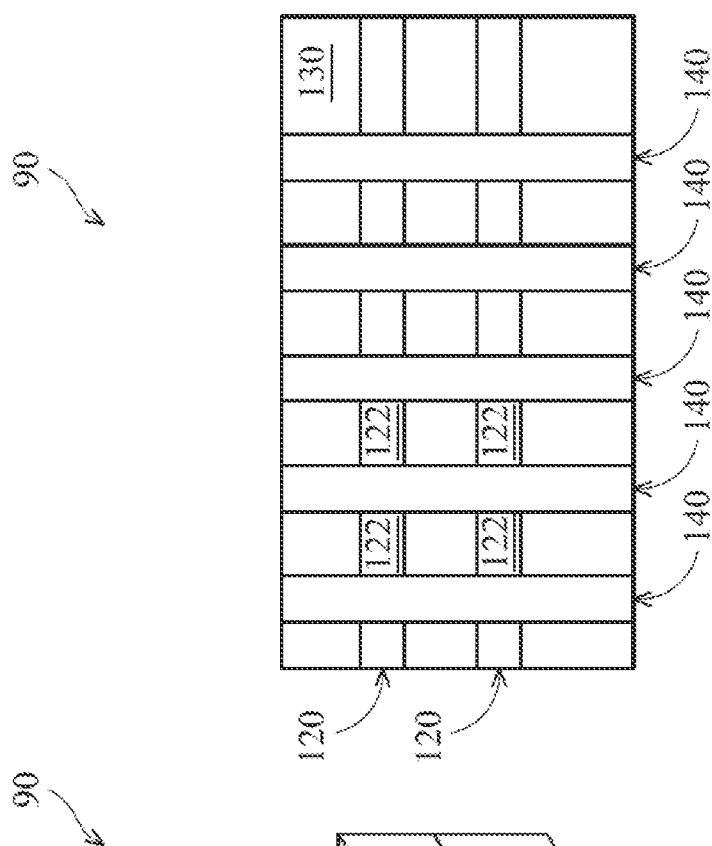
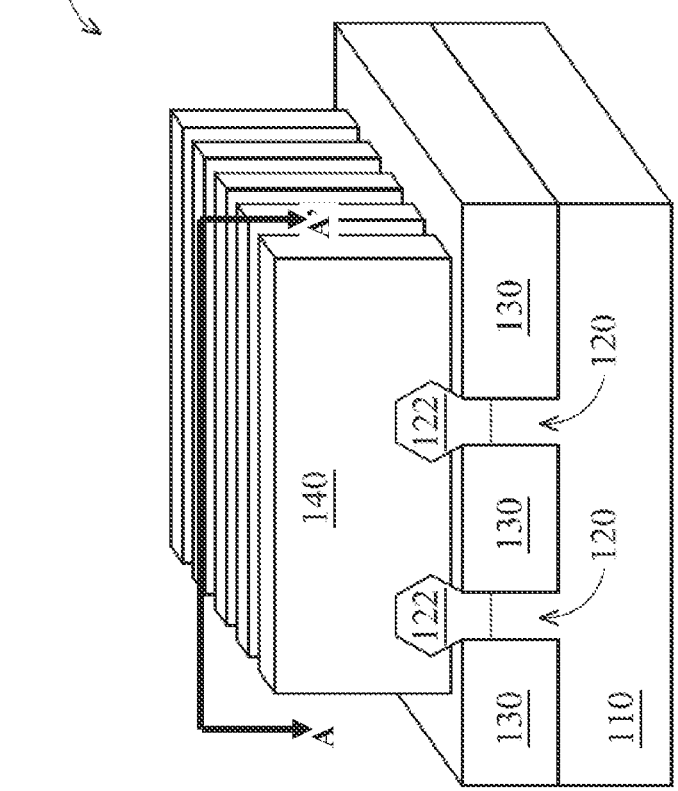
Fig.1A
Fig.1B

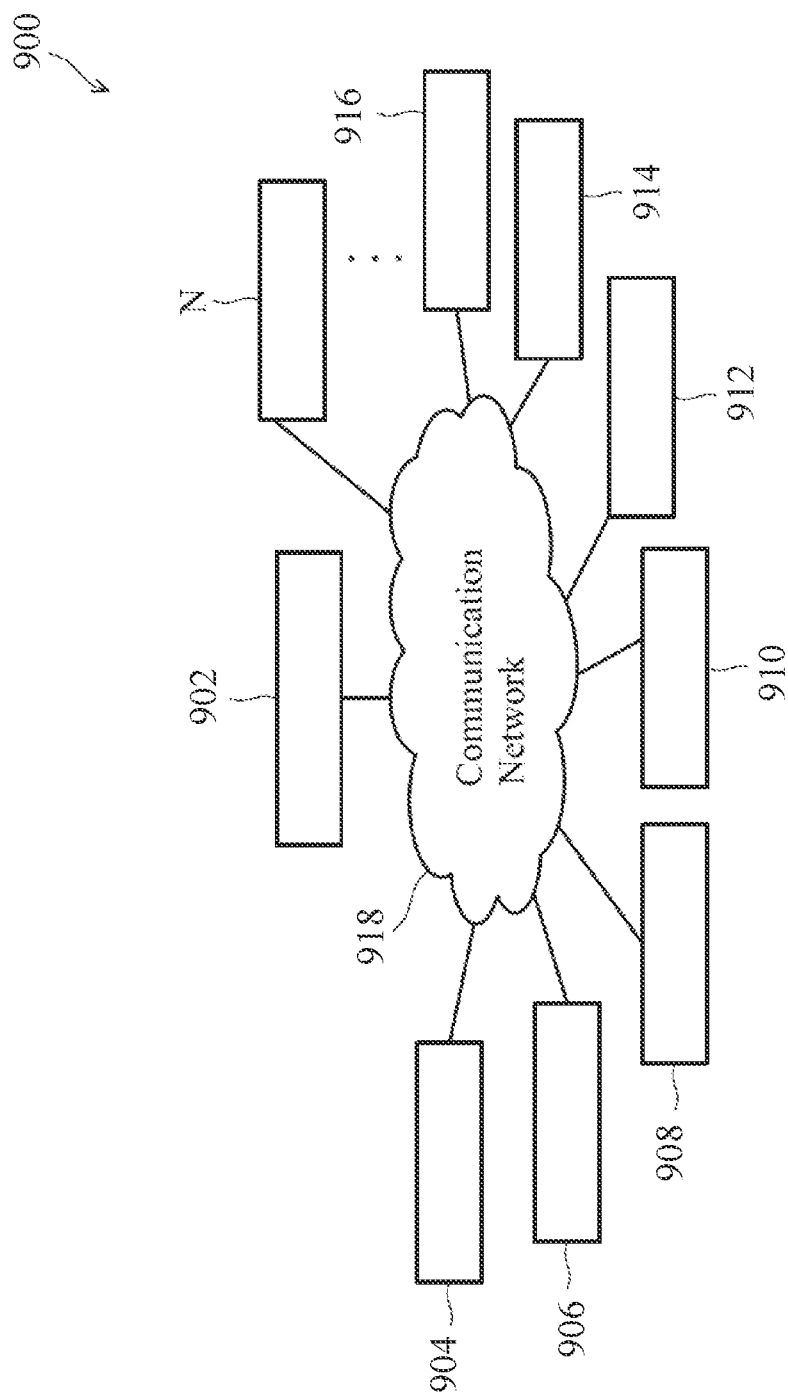

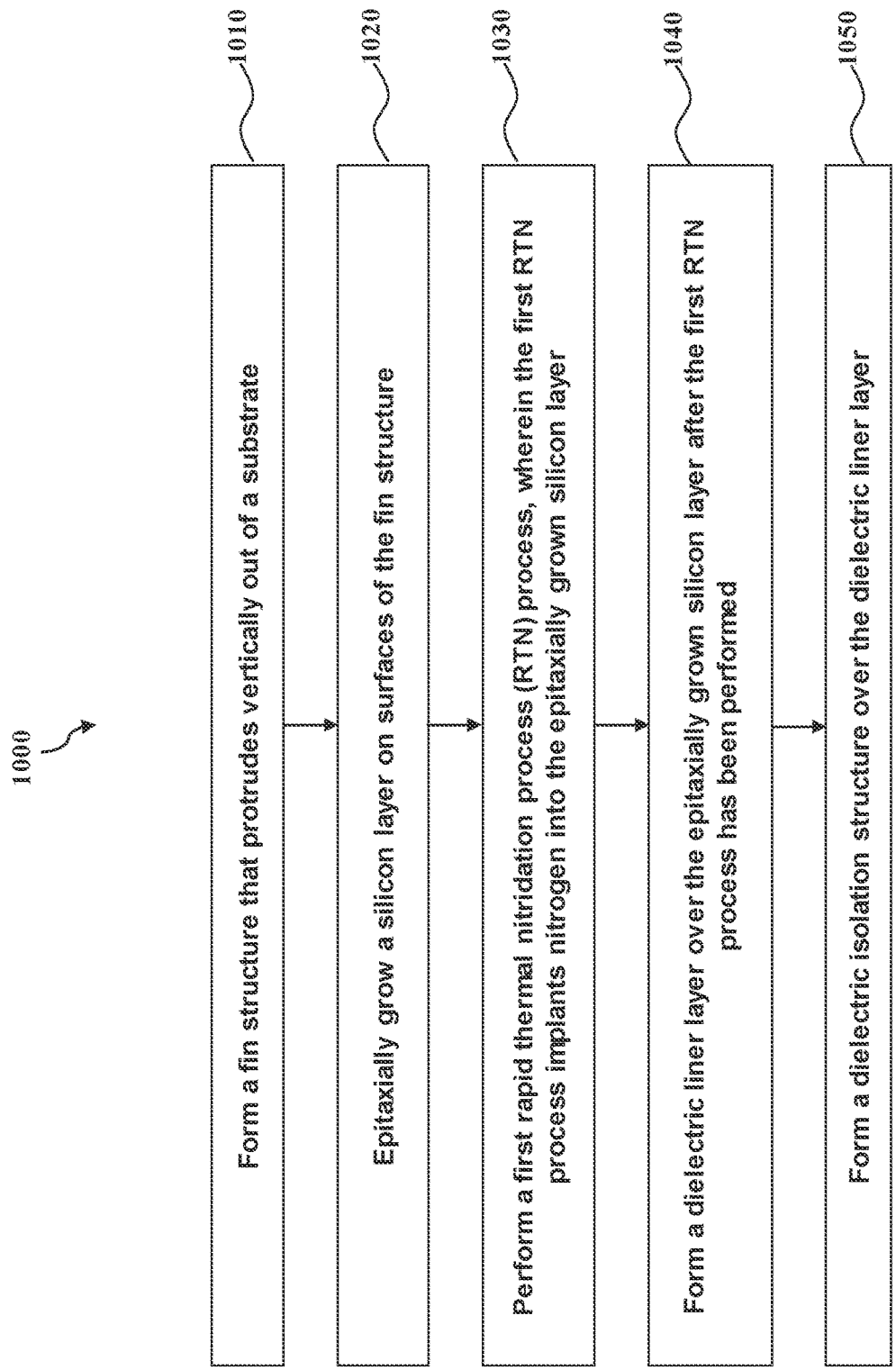

NITRIDE-CONTAINING STI LINER FOR SiGe CHANNEL

PRIORITY DATA

The present application is a utility patent application of, and claims priority to, Provisional U.S. Pat. App. No. 63/065,084, filed on Aug. 13, 2020, entitled "FinFET Device With Multi-Liner Structure", and also to Provisional U.S. Pat. App. No. 63/072,808, filed on Aug. 31, 2020, entitled "FinFET Device With Multi-Liner Structure", the disclosures of each of which are hereby incorporated by reference in their respective entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices continue to get scaled down, silicon germanium has been used to form the channel region of P-type transistors. However, silicon germanium channels oxidize faster than silicon channels. Conventional methods of semiconductor fabrication have not sufficiently taken this difference into account. As a result, conventional methods of fabricating semiconductor devices with silicon germanium channels may experience degraded performance or a lower yield.

Therefore, although conventional methods of fabricating semiconductor devices have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a perspective view of an IC device in the form of a FinFET according to various aspects of the present disclosure.

FIG. 1B is a planar top view of an IC device in the form of a FinFET according to various aspects of the present disclosure.

FIG. 12 is a block diagram of a manufacturing system according to various aspects of the present disclosure.

FIG. 13 is a flowchart illustrating a method of fabricating a semiconductor device according to various aspects of the present disclosure.

DETAILED DESCRIPTION

Figure 1C:
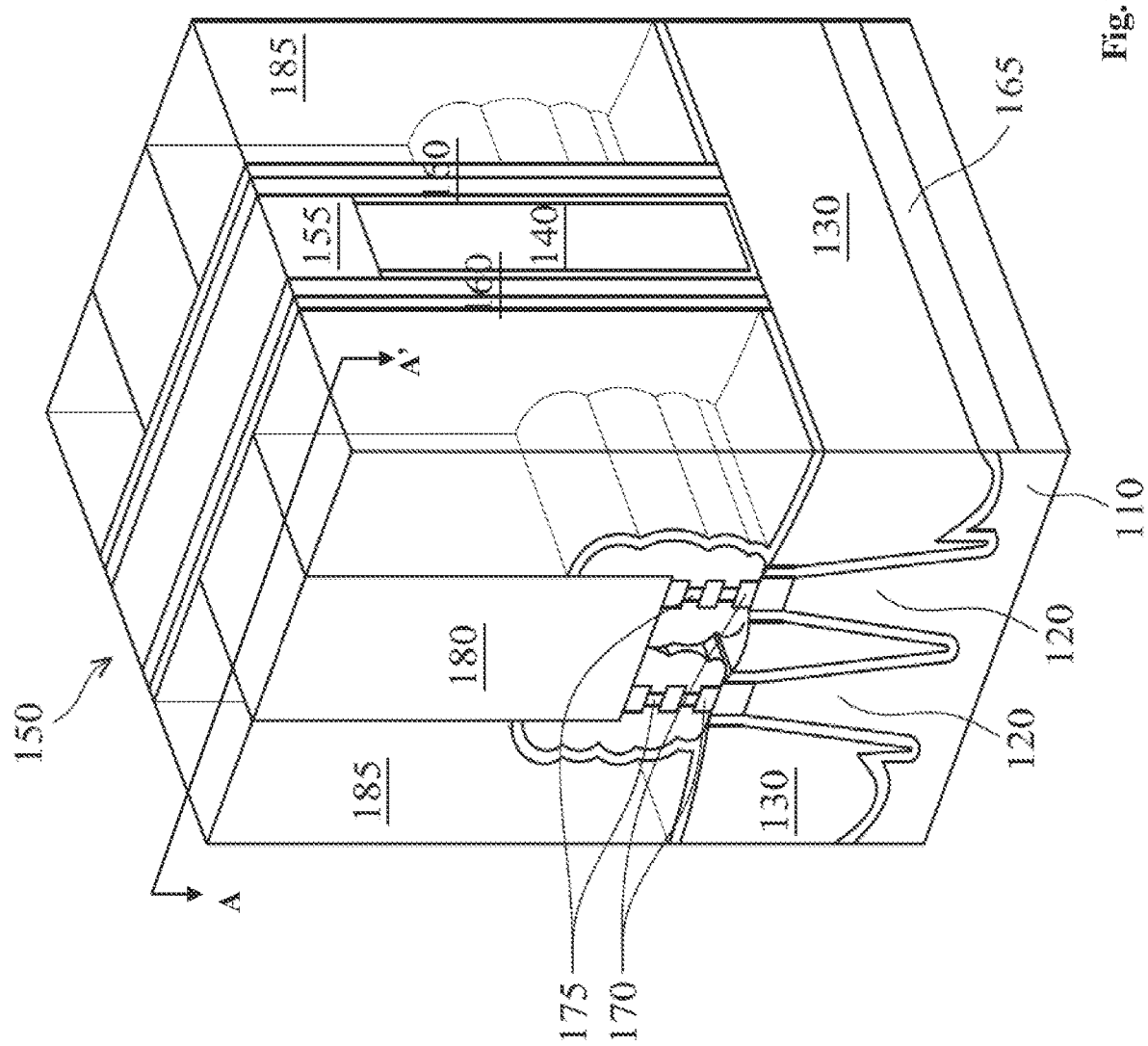
FIG. 1C is a perspective view of an IC device in the form of a GAA device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs, three-dimensional fin-line FETs (FinFETs), or gate-all-around (GAA) devices. One aspect of the present disclosure involves forming STI liners to protect semiconductor channels (e.g., silicon germanium channels), where the STI liners contain silicon nitride. In some embodiments, multiple STI liners having different material compositions may be formed over the semiconductor channels for the protection thereof. As a result, device performance and/or yield may be improved, as discussed below in more detail.

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. As device sizes continue to shrink, these source/drain features 122 may merge into one another even when they are meant to be kept separate. This is the problem that the present disclosure overcomes, as discussed below in more detail.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2-10 illustrate the cross-sectional side views of an IC device 200 at different stages of fabrication. Specifically, FIGS. 2-10 correspond to the cross-sectional cuts taken along an Y-direction, for example along the cutline A-A' in FIG. 1A or FIG. 1C. As such, FIGS. 2-10 may be referred to as Y-cut Figures. For reasons of consistency and clarity, similar components appearing in FIGS. 2-10 will be labeled the same.

Figure 2:
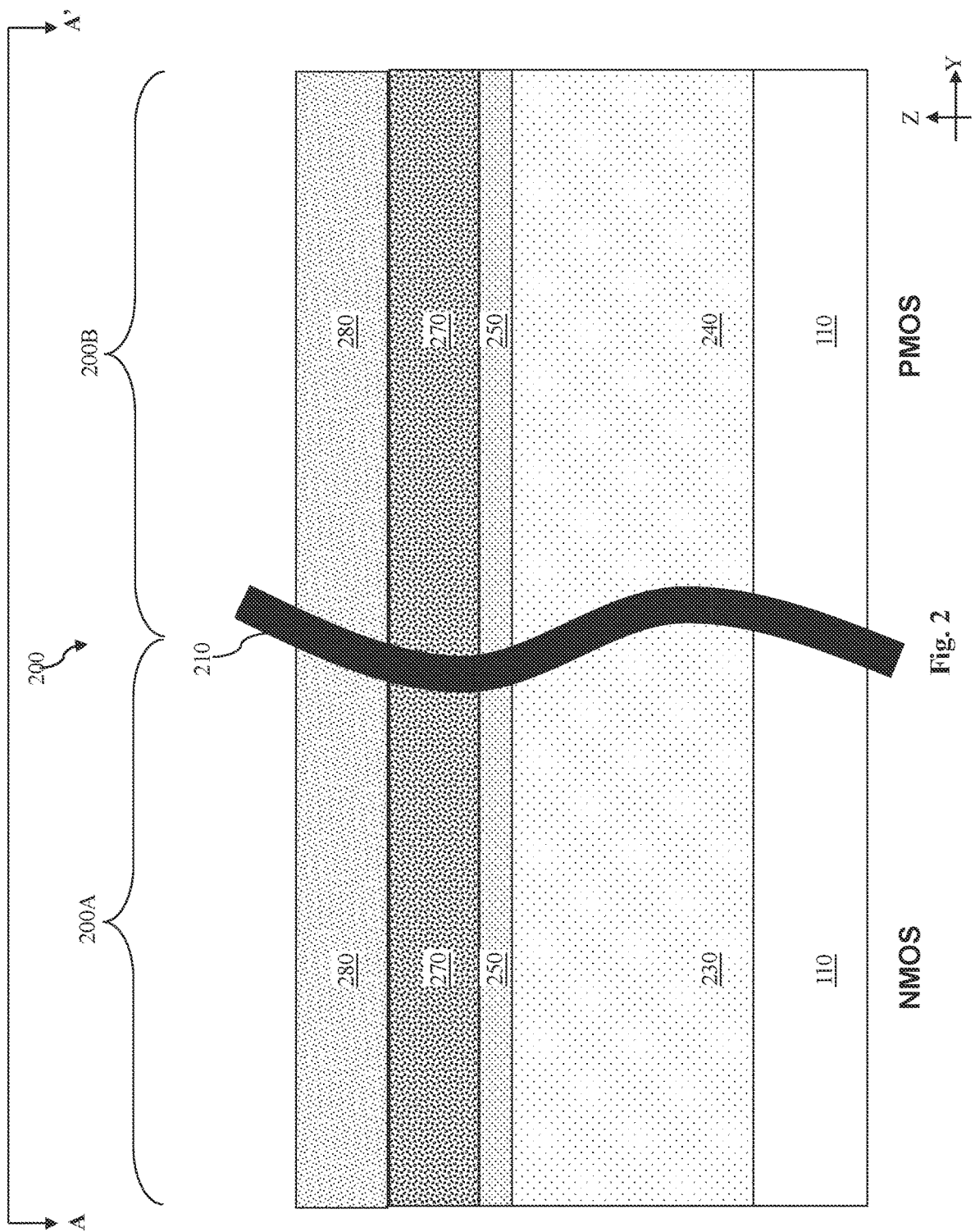
FIGS. 2-10 are cross-sectional side views of various embodiments of IC devices at various stages of fabrication according to various aspects of the present disclosure.

Referring to FIG. 2, the IC device 200 includes an NMOS (also referred to as NFET) region 200A and a PMOS (also referred to as PFET) region 200B. It is understood that the NMOS region 200A and the PMOS region 200B may or may not be disposed adjacent to one another, but for the sake of simplicity of illustration, the NMOS region 200A and the PMOS region 200B are illustrated simultaneously in FIG. 2 and in the subsequent figures. A divider 210 (not corresponding to a physical structure in the IC device 200) shown herein represents the separation between the NMOS region 200A and the PMOS region 200B.

The IC device 200 includes the substrate 110 in both the NMOS region 200A and the PMOS region 200B. The substrate 110 may be implemented using the substrate discussed above with reference to FIGS. 1A-1C, for example, a silicon substrate. Doped regions, or doped wells, may be formed in the substrate 110. For example, the substrate 110 in the NMOS region 200A may include a P-well, and the substrate 110 in the PMOS region 200B may include an N-well. Accordingly, transistors having different types of conductivity may be formed in the NMOS region 200A and the PMOS region 200B. The doped wells may be formed using one or more ion implantation processes. The dopant ions may include an n-type material in some embodiments, for example arsenic (As) or phosphorous (P), or they may include a p-type material in some other embodiments, for example boron (B), depending on whether an NFET or a PFET is needed.

An epitaxial semiconductor layer 230 is formed over the substrate 110 in the NMOS region 200A, and an epitaxial semiconductor layer 240 is formed over the substrate 110 in the PMOS region 200B. In some embodiments, the epitaxial semiconductor layer 230 includes silicon (Si), and the epitaxial semiconductor layer 240 includes silicon germanium (SiGe). The epitaxial semiconductor layers 230 and 240 may be formed using one or more epitaxial growth processes in combination with one or more patterning processes. For example, in some embodiments, the epitaxial semiconductor layer 230 may be epitaxially grown over the substrate 110 in both the NMOS region 200A and the PMOS region 200B. Thereafter, a patterning process may be performed to remove the portion of the epitaxial semiconductor layer 230 formed in the PMOS region 200B, and the epitaxial semiconductor layer 240 may be epitaxially grown over the substrate 110 in just the PMOS region 200B. The epitaxial semiconductor layers 230 and 240 will undergo patterning processes to form fin structures of the NMOS region 200A and the PMOS region 200B, where portions of the fin structures will serve as the channel regions of the transistors of the NMOS region 200A and the PMOS region 200B.

A buffer layer 250 (also referred to as a capping layer) may be formed over the epitaxial semiconductor layers 230 and 240 in both the NMOS region 200A and the PMOS region 200B. In some embodiments, the buffer layer 250 may include a semiconductor material, such as silicon, and it may be formed using one or more deposition processes, for example, chemical vapor deposition (CVD), physical vapor deposition (PVD), atomic layer deposition (ALD), or combinations thereof. The buffer layer 250 protects the epitaxial semiconductor layers 230 and 240 from undesirable oxidation. For example, if exposed to ambient air (which contains oxygen), the silicon germanium material in the epitaxial semiconductor layer 240 may easily become oxidized, which is undesirable as it may adversely affect the intended function of the silicon germanium material (e.g., to serve as a semi-conductive material). The formation of the buffer layer 250 helps to prevents the epitaxial semiconductor layers 230 and 240 from air exposure, and as such it prevents the potential oxidation of the silicon or silicon germanium material of the epitaxial semiconductor layers 230 and 240. The buffer layer 250 may be removed in a later process.

A dielectric layer 270 is formed over the buffer layer 250. In some embodiments, the dielectric layer 270 includes silicon oxide and may be referred to as a pad oxide layer. A dielectric layer 280 is then formed over the dielectric layer 270. In some embodiments, the dielectric layer 280 includes silicon nitride and may be referred to as a pad nitride layer. The dielectric layers 270 and 280 may serve as materials for a hard mask for a subsequent photolithography patterning process.

Figure 3:
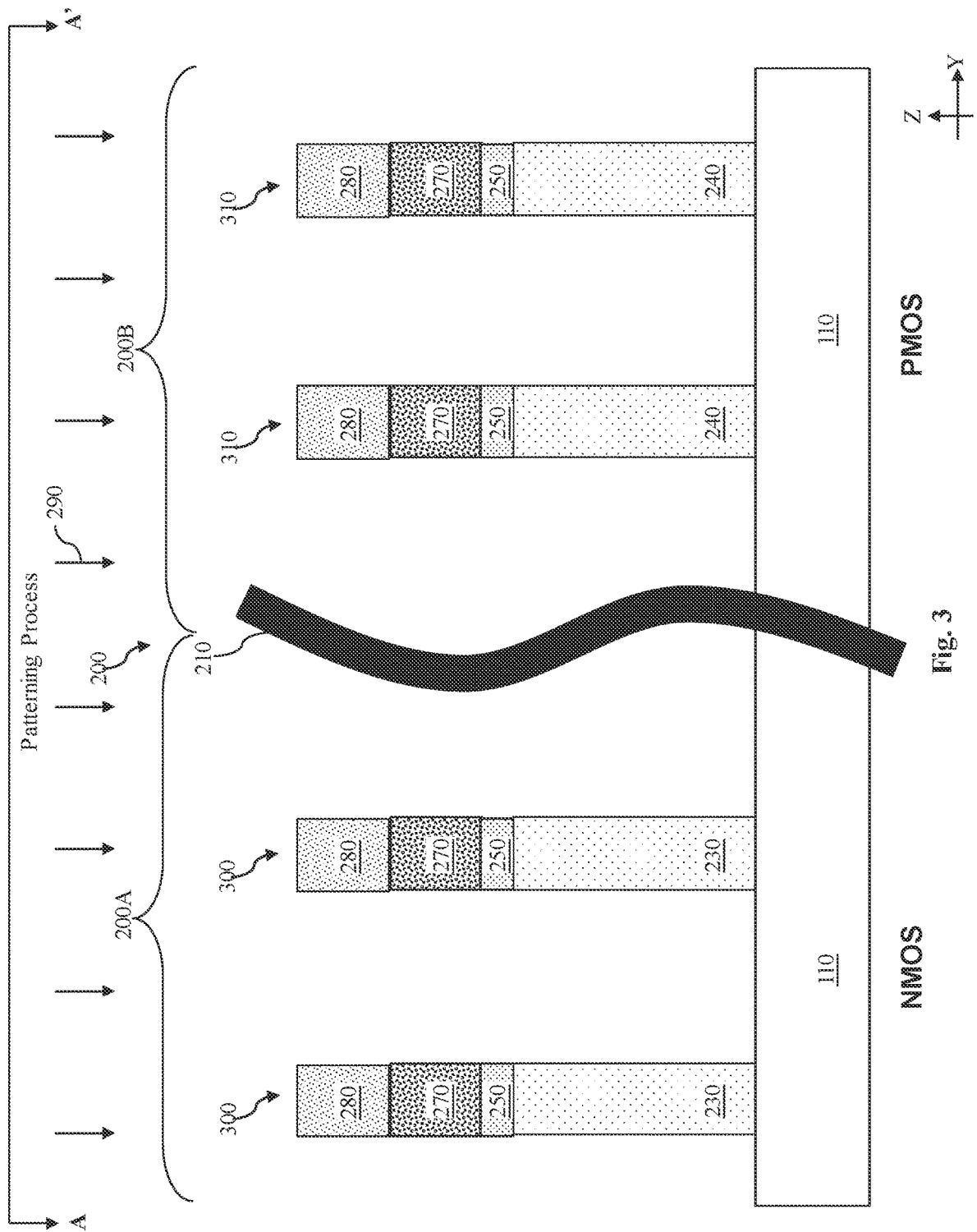

Referring now to FIG. 3, an OD (active region) patterning process 290 is performed to form upwardly-protruding (e.g., upwardly in the Z-direction) NMOS fin structures 300 in the NMOS region 200A and the PMOS fin structures 310 in the PMOS region 200B. As a part of the OD patterning process 290, the dielectric layers 270 and 280 may be patterned (e.g., using a patterned photoresist layer) to form patterned hard masks that define the lateral dimensions of the NMOS fin structures 300 and the PMOS fin structures 310.

The patterned hard masks 270/280 are then used to pattern the layers therebelow. For example, portions of the layers 250, 240 and 230 not protected by the patterned masks 270/280 are etched away in one or more etching processes. As shown in FIG. 3, the epitaxial semiconductor layer 230 is etched so that the remaining portion thereof protrude upwardly from the substrate 110 as parts of the NMOS fin structure 300, and the epitaxial semiconductor layer 240 is etched so that the remaining portion thereof protrude upwardly from the substrate 110 as parts of the PMOS fin structure 310. The channel and source/drain regions of the transistors in the NMOS region 200A and the transistors in the PMOS region 200B may be formed in the NMOS fin structures 300 and in the PMOS fin structures 310, for example in the epitaxially semiconductor layers 230 and 240, respectively. In some embodiments, n-type full-strained channels (NFSCs) are formed using the NMOS fin structures 300, and p-type full-strained channels (PFSCs) are formed using the PMOS fin structures 310.

The patterning process 290 may cause damage to the NMOS fin structures 300 and the PMOS fin structures 310. For example, the etching processes performed during the patterning process 290 may roughen the surfaces of the NMOS fin structures 300 and the PMOS fin structures 310. For example, the surfaces of the NMOS fin structures 300 and the PMOS fin structures 310 (e.g., the epitaxial semiconductor layers 230 and 240) may have a first surface roughness at this stage of fabrication, where the first roughness is rougher than desired. In addition, the NMOS fin structures 300 and the PMOS fin structures 310 may become exposed to oxygen or moisture (e.g., ambient air or steam), for example due to the formation of silicon oxide materials during the fabrication of the IC device 200. This may also be undesirable, as such exposure may oxidize the NMOS fin structures 300 and the PMOS fin structures 310. To make matters worse, silicon germanium (e.g., of the PMOS fin structures 310) is oxidized at a significantly faster rate than silicon (e.g., of the NMOS fin structures 300). Conventional semiconductor fabrication has not taken this difference in oxidation rate into account, and therefore no special care has been taken to address the undesirable faster oxidation of silicon germanium. The present disclosure will form nitride-containing liners to alleviate these problems, as discussed below in more detail.

Figure 4:
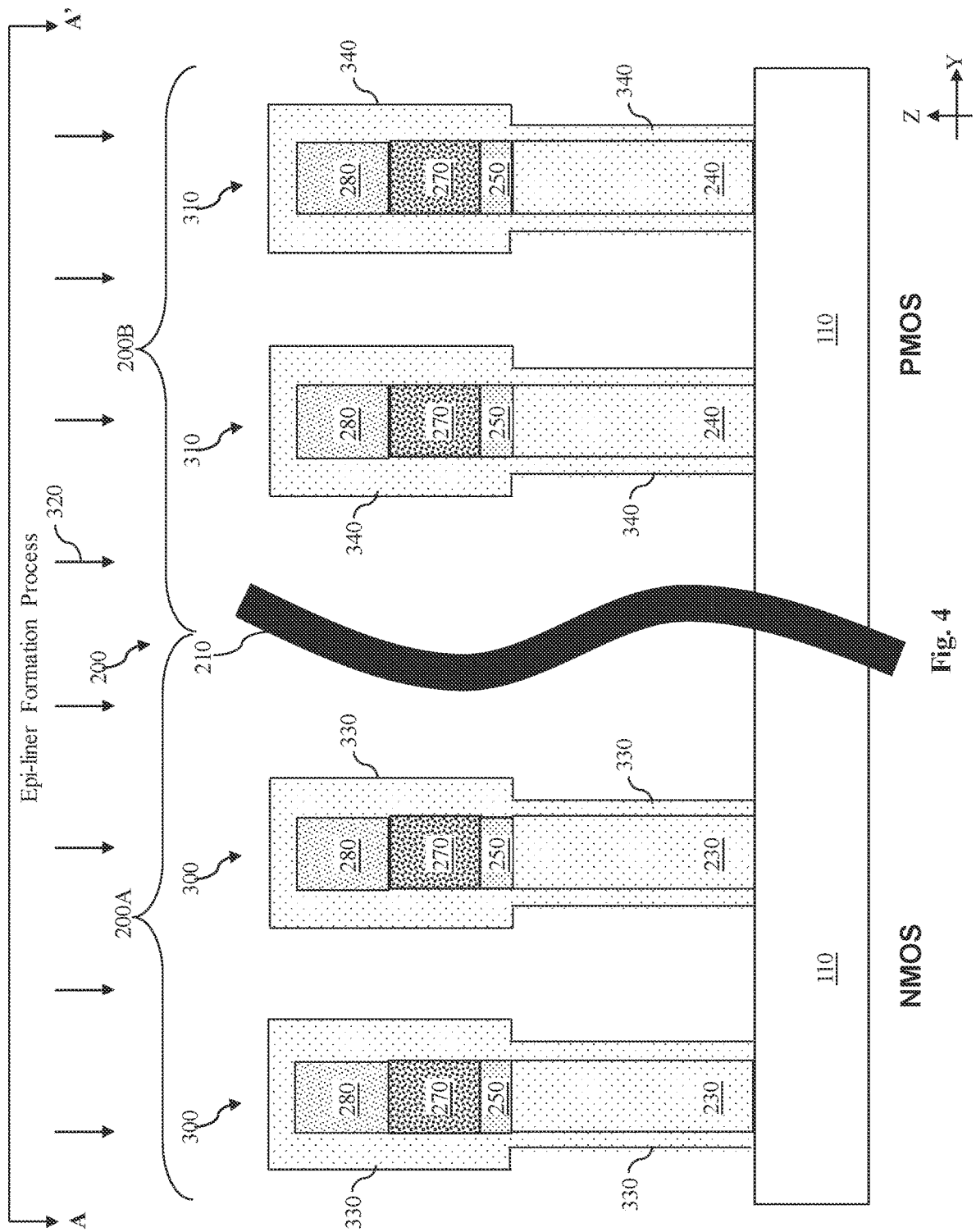

Referring now to FIG. 4, an epi-liner formation process 320 is performed to the IC device 200 to form epi-liners 330 on the NMOS fin structures 300 and to form epi-liners 340 on the PMOS fin structures 310, including on the exposed surfaces of the various layers 230, 240, 250, 270 and 280. In some embodiments, the epi-liner formation process 320 includes an epitaxial growth process, and epi-liners 330 and 340 each include epitaxially-grown silicon. For example, the portions of the epi-liners 330 and 340 grown on the epitaxial semiconductor layers 230 and 240 include crystal silicon. In comparison, since the dielectric layers 270 and 280 contain dielectric materials, rather than crystal semiconductor materials, the portions of the epi-liners 330 and 340 grown on the layers 270 and 280 include amorphous silicon. Note that due at least in part to the differences in material composition (e.g., crystal silicon versus amorphous silicon), the portions of the epi-liners 330 and 340 formed over the side surfaces of the epitaxial semiconductor layers 230 and 240 are substantially thinner than the portions of the epi-liners 330 and 340 formed over the side surfaces of the dielectric layers 270 and 280. Additional descriptions regarding the formation of the epi-liners 330 and 340 are disclosed in U.S. patent application Ser. No. 17/109,895, filed on Dec. 20, 2020, and entitled "Method of Manufacturing A Semiconductor Device and A Semiconductor Device", the disclosure of which is hereby incorporated by reference in its entirety.

The epi-liners 330 and 340 help to smoothen the surfaces of the epitaxial semiconductor layers 230 and 240, respectively, which have been roughened or damaged from prior etching processes and/or other processes. For example, the epi-liners 330 and 340 may have a second surface roughness that is smaller than the first surface roughness of the epitaxial semiconductor layers 230 and 240. The epi-liners 330 and 340 may also help to prevent or reduce oxidation of the epitaxial semiconductor layers 230 and 240, which may occur from previous or subsequent processing steps. However, the presence of the epi-liners alone may not be completely sufficient to achieve these goals. As such, additional processing is performed to further protect the epitaxial semiconductor layer 230 and 240.

Figure 5:
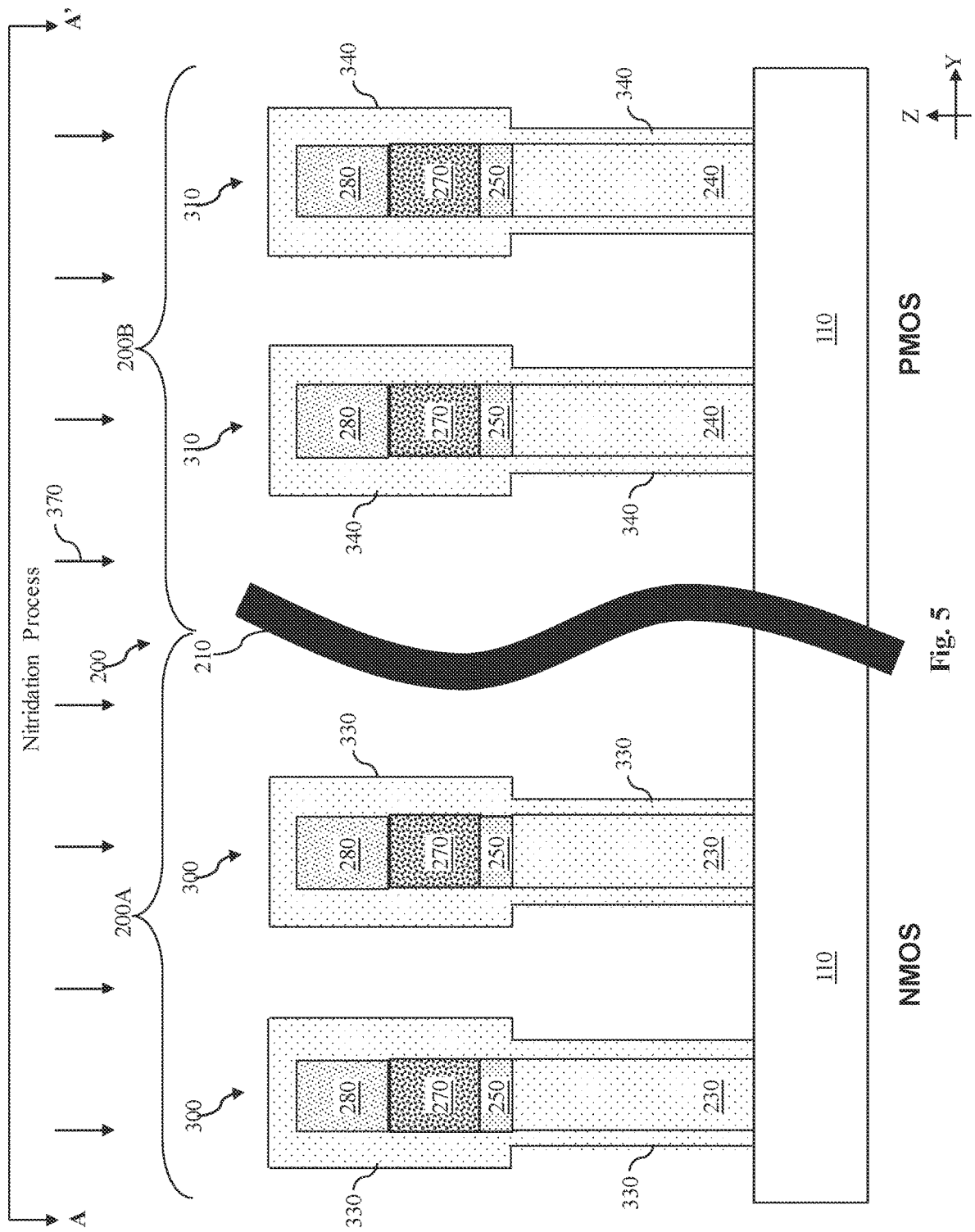

For example, referring now to FIG. 5, a nitridation process 370 is performed to the IC device 200 according to a first embodiment of the present disclosure. In some embodiments, the nitridation process 370 includes a rapid thermal nitridation process that is performed in a chamber at a temperature range between about 600 degrees Celsius and about 800 degrees Celsius, for a time duration between about 30 seconds and about 180 seconds. The nitridation process 370 implants nitrogen into the epi-liners 330 and 340, which may help repair the surface damage of the epi-liners 330 and 340. For example, the epi-liners 330 and 340 may be smoother as a result of the nitridation process 370.

Figure 6:
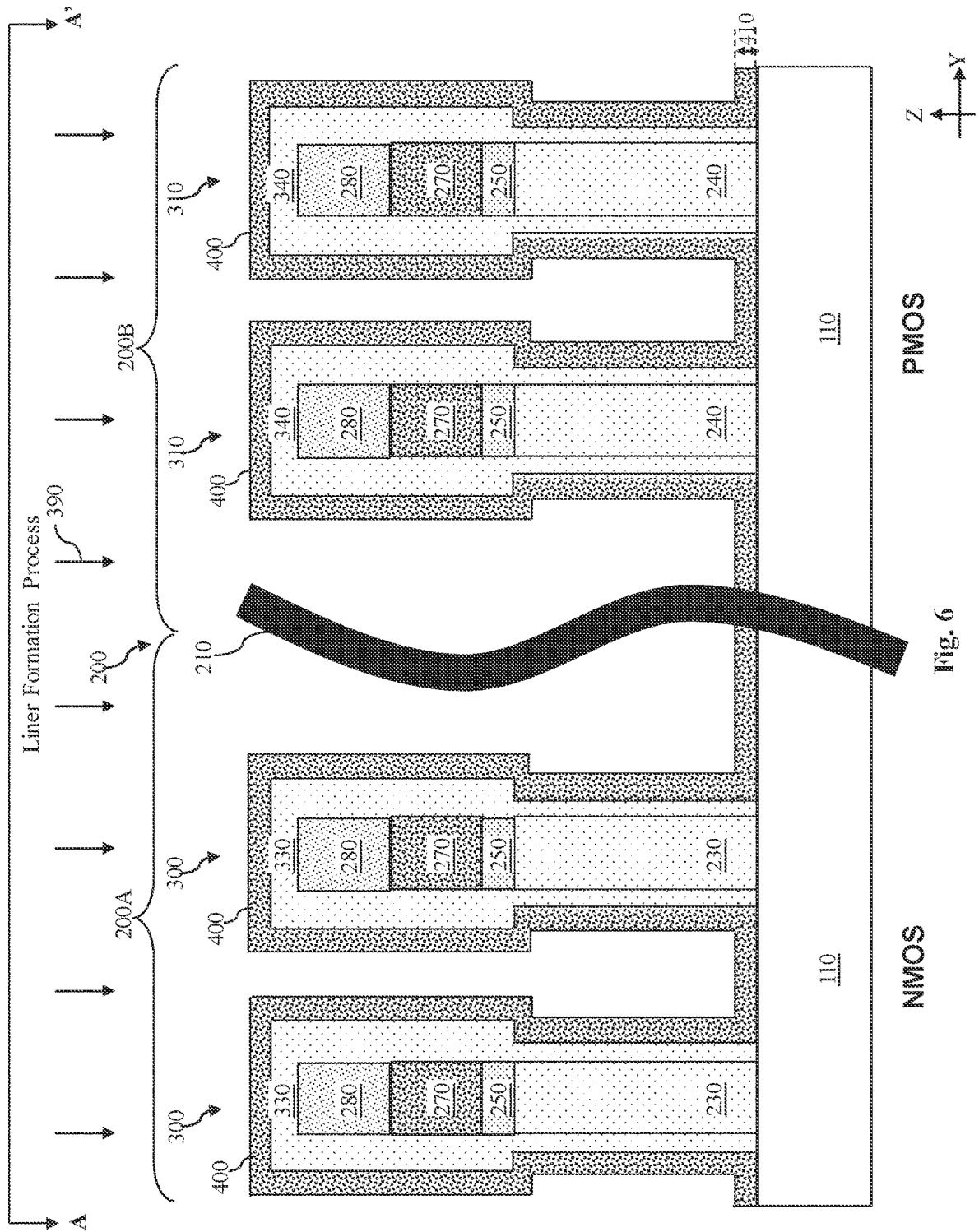

Referring now to FIG. 6, a liner formation process 390 is performed to the IC device 200 to form a liner layer 400 over the NMOS fin structures 300 and PMOS fin structures 310, for example on the upper and side surfaces of the epi-liners 330 and 340. In some embodiments, the liner layer 400 is formed to include silicon oxide. The liner layer 400 may be formed by an atomic layer deposition (ALD) process, so that a thickness 410 of the liner layer 400 can be precisely controlled. In some embodiments, the thickness 410 is formed to be in a range between about 20 nm and about 40 nm. This range of the thickness 410 is not arbitrarily chosen but actually specifically configured to ensure that the liner layer 400 is sufficiently thick to adequately protect the layers underneath from oxidation or other damage, but not too thick to interfere with subsequent fabrication processing steps.

In some embodiments, the formation of the liner layer 400 may involve processes such as wet oxidation (e.g., in-situ steam generation) and/or plasma enhanced oxidation. These processes may be performed in a processing chamber where hydrogen and oxygen are introduced. The temperature of the wafer may be sufficiently high to initiate conversion of the hydrogen and oxygen into water, and/or lead to the presence of atomic oxygen and hydroxyl radicals (OH) on the wafer surface, which is unintentional and undesirable. However, the present disclosure has already implanted nitrogen into the epi-liners 330 and 340, which makes the epi-liners 330 and 340 more hydrophobic. As such, even if water were to be formed undesirably, the nitrogen-containing epi-liners 330 and 340 would be capable of protecting the layers underneath (e.g., the epitaxial semiconductor layers 230 and 240) from the water and/or the atomic oxygen and hydroxyl radicals (OH), which is one of the advantages of the present disclosure.

Figure 7:
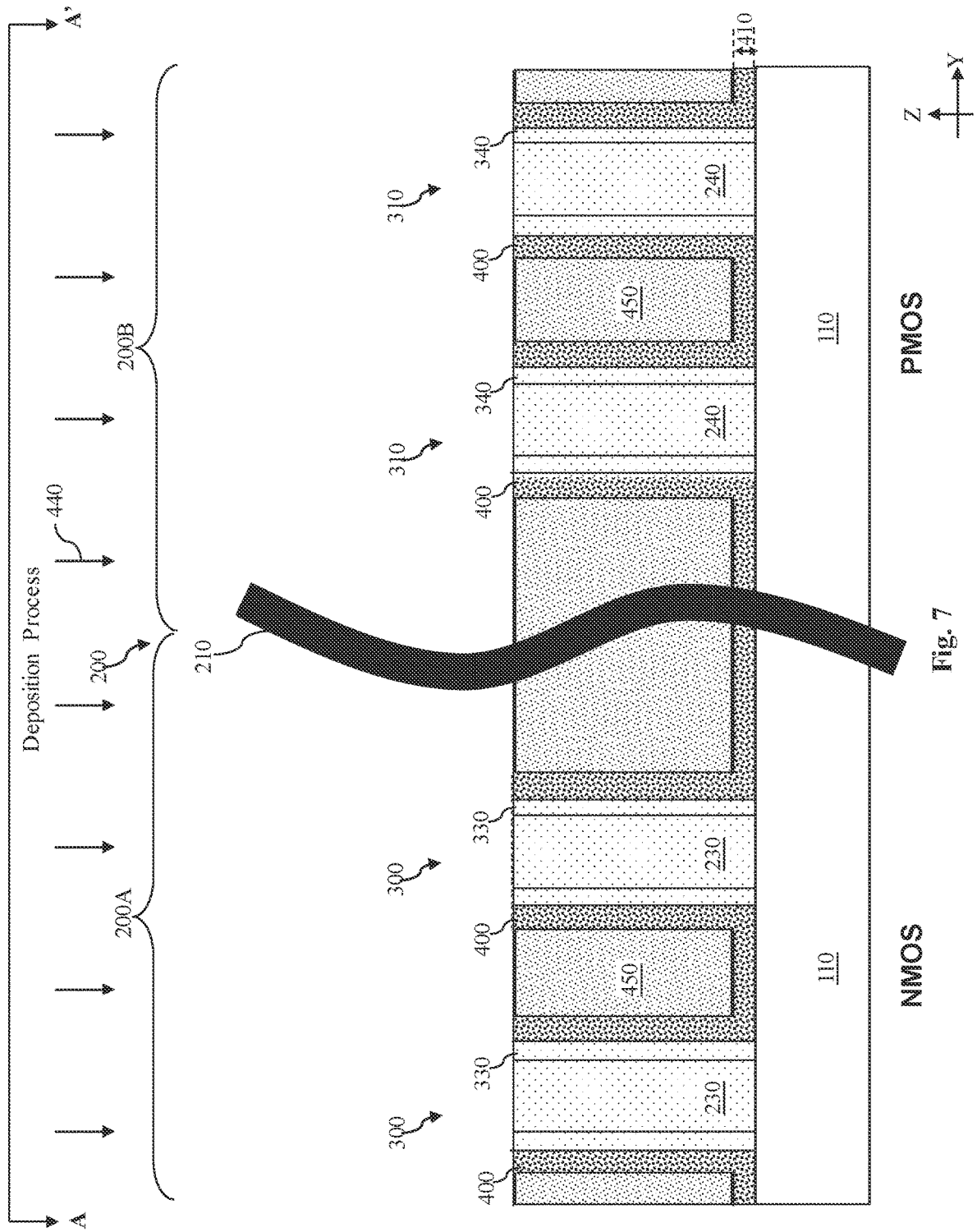

Referring now to FIG. 7, a deposition process 440 is performed to the IC device 200 to form a dielectric isolation structure 450 directly on the liner layer 400. In some embodiments, the deposition process 440 may include a Furnace Chemical Vapor Deposition (FCVD) process. The dielectric isolation structure 450 is formed to fill the gaps or trenches between the NMOS and PMOS fin structures 300 and 310. The dielectric isolation structure 450 may include a shallow-trench-isolation (STI) structure in some embodiments. Since the STI structure is formed on the liner layer 400, the liner layer 400 may also be referred to as an STI liner. The dielectric isolation structure 450 may include an oxide material in some embodiments, for example silicon oxide. Before or after the formation of the dielectric isolation structure 450, a polishing process such as a CMP process may be performed to remove the dielectric layers 270 and 280 (as well as portions of the dielectric isolation structure 450). The polishing process may also remove the buffer layer 250 in some embodiments.

FIGS. 2-7 correspond to a first embodiment of the present disclosure. In other words, according to the first embodiment, a nitridation process is performed to implant nitrogen into the epi-liners 330 and 340, followed by the deposition of the oxide-containing liner layer 400 on the epi-liners 330 and 340, and then the dielectric isolation structure 450 is formed directly on the liner layer 400. However, the present disclosure is not limited to such an embodiment. A second embodiment, a third embodiment, and a fourth embodiment of the present disclosure are shown and discussed below with reference to FIGS. 8-10, respectively. For reasons of consistency and clarity, similar components in the first, second, third, and fourth embodiments are labeled the same.

Figure 8:
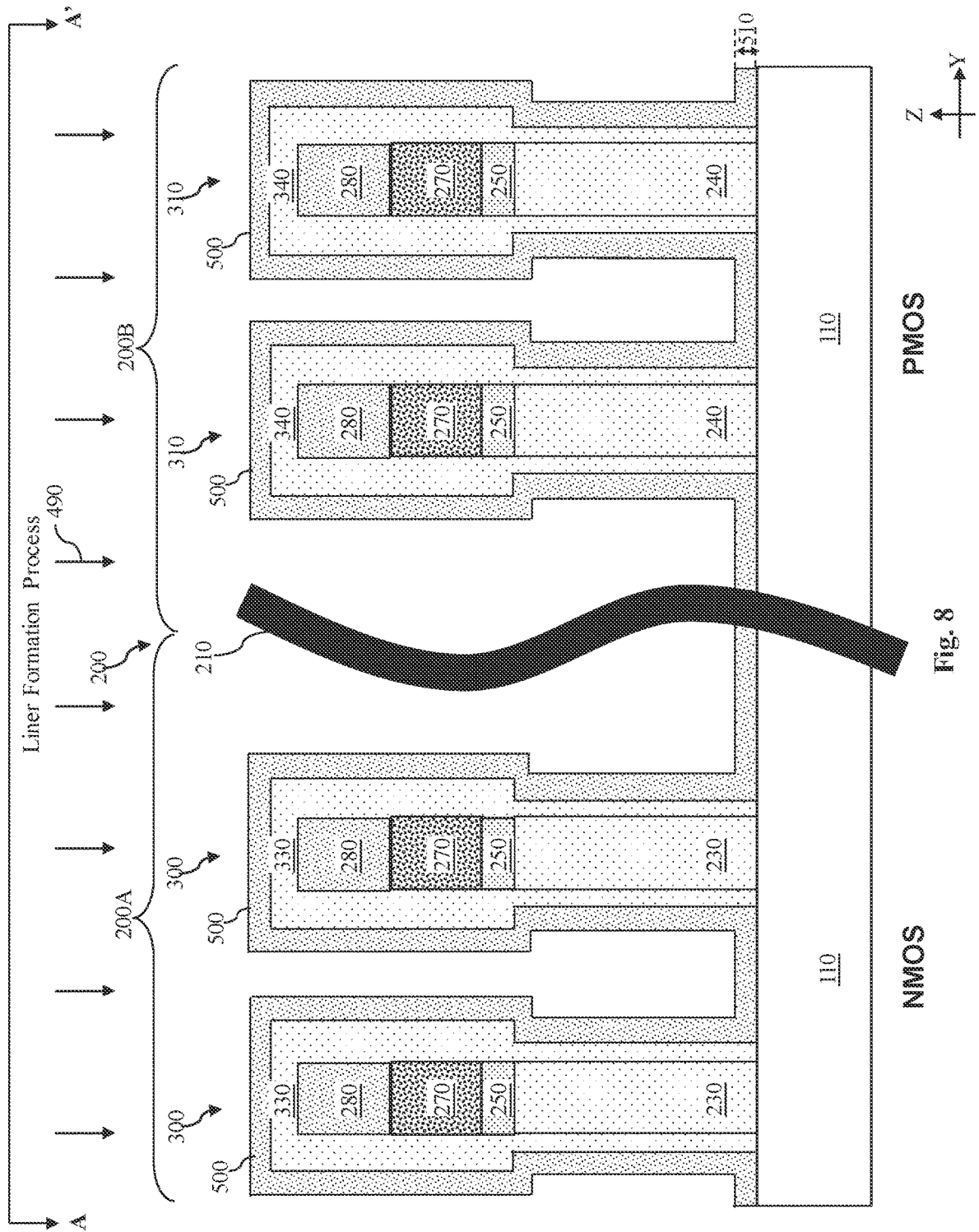

Referring to FIG. 8, the IC device 200 in the second embodiment has also undergone the nitridation process 370 discussed above with reference to FIG. 5. That is, nitrogen has been implanted to the epi-liners 330 and 340 to repair the surficial damage of the epi-liners, as well as to better protect the epi-liners 330 and 340 during subsequent fabrication processing steps. However, unlike the first embodiment, the IC device 200 in the second embodiment does not undergo a liner formation process 390, but rather undergoes a liner formation process 490. The liner formation process 490 forms a liner layer 500 over the NMOS fin structures 300 and PMOS fin structures 310, for example on the upper and side surfaces of the epi-liners 330 and 340. In some embodiments, the liner layer 500 is formed to include silicon nitride, which as discussed above may offer certain benefits over other types of materials. For example, silicon nitride has good hydrophobicity (e.g., compared to oxide materials). As such, the liner layer 500 can adequately protect the layers underneath (e.g., the silicon germanium of the epitaxial semiconductor layer 340) from water or other oxidizing elements. Silicon nitride is also a good candidate material for recovering the surficial damage to the epi-liners 330 or 340.

The liner layer 500 may be formed by an atomic layer deposition (ALD) process, so that a thickness 510 of the liner layer 500 can be precisely controlled. In some embodiments, the thickness 510 is formed to be in a range between about 20 nm and about 40 nm. This range of the thickness 510 is not arbitrarily chosen but actually specifically configured to ensure that the liner layer 500 is sufficiently thick to adequately protect the layers underneath from oxidation or other damage, but not too thick to interfere with the subsequent fabrication processing steps.

Figure 9:
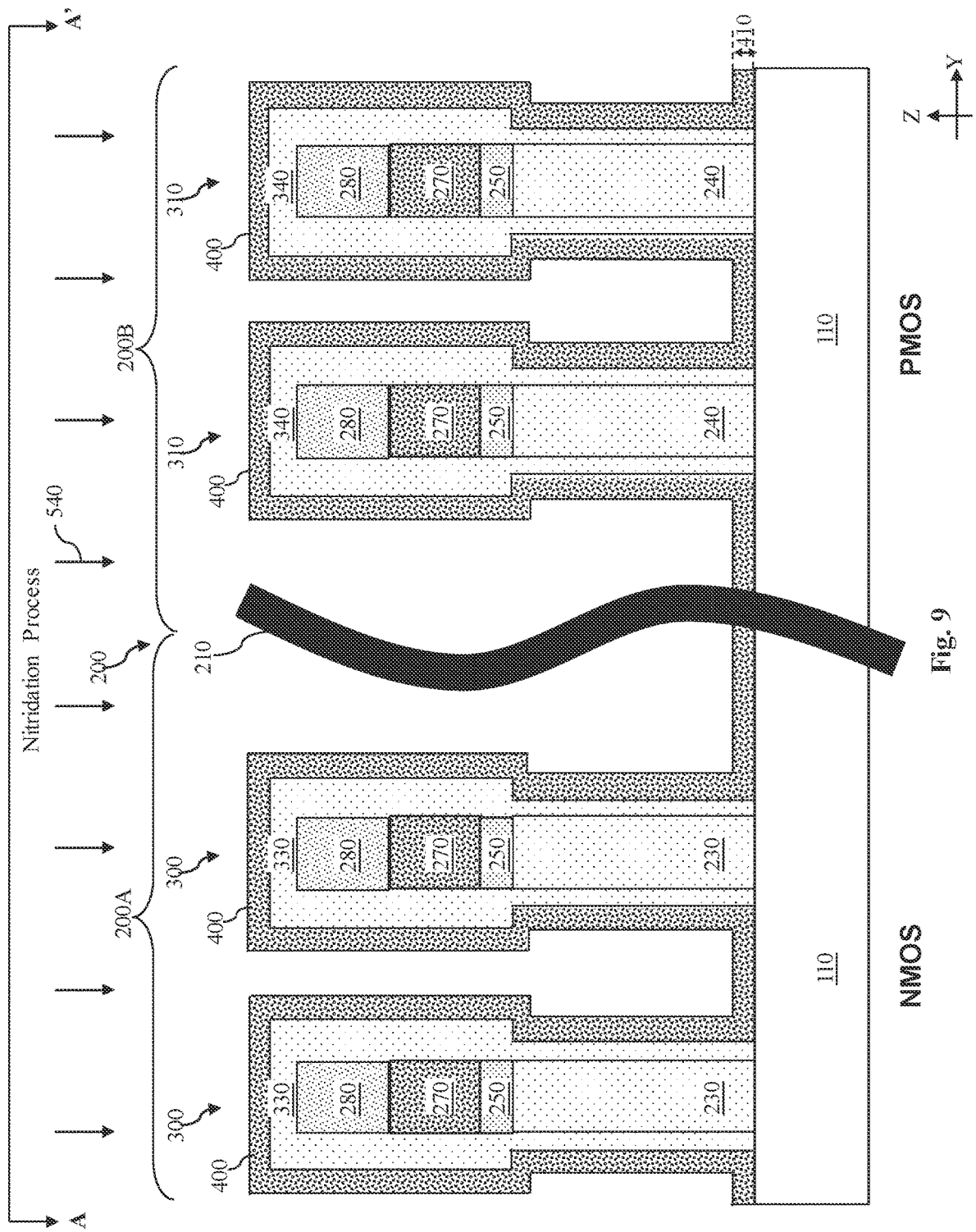

Referring now to FIG. 9, the third embodiment of the present disclosure is shown. According to the third embodiment, the nitridation process 370 has already been performed to implant nitrogen into the epi-liners 330 and 340, and the liner layer 400 has also been formed. Thereafter, another nitridation process 540 is also performed to the IC device 200 to implant nitrogen into the liner layer 400. In some embodiments, the nitridation process 540 is substantially similar to the nitridation process 370, for example, the nitridation process 540 may also include a rapid thermal nitridation process that is performed in a chamber at a temperature range between about 600 degrees Celsius and about 800 degrees Celsius, for a time duration between about 30 seconds and about 180 seconds. The nitrogen implantation into the liner layer 400 also may help repair the surface damage of the liner layer 400 and help it withstand subsequent fabrication processes. For example, as a result of the nitridation process 540, the liner layer 400 may be smoother and may be better able to withstand the undesirable effects of water and/or oxygen.

Figure 10:
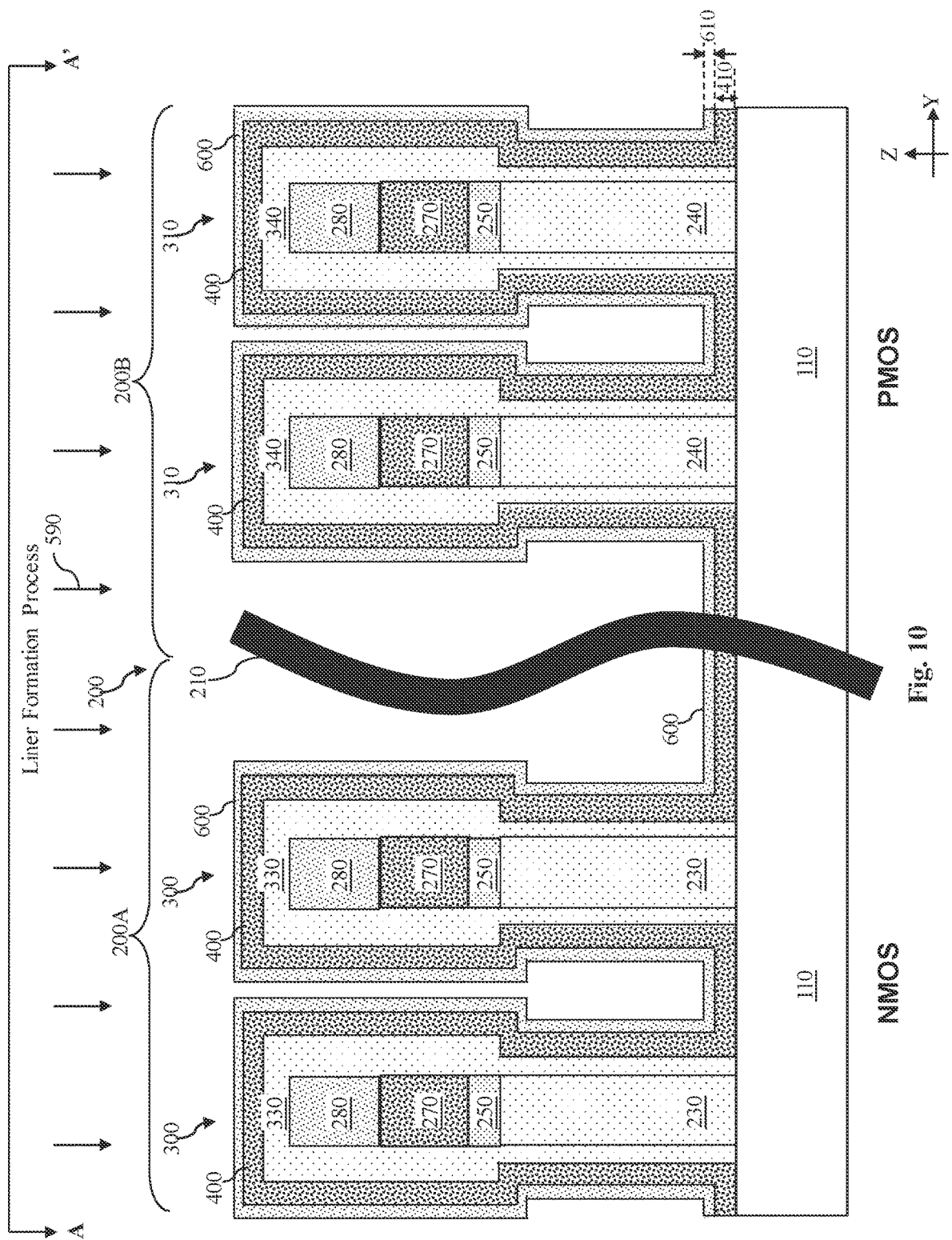

Referring now to FIG. 10, the fourth embodiment of the present disclosure is shown. According to the fourth embodiment, the IC device 200 has already undergone the same fabrication processing performed in the third embodiment, such as the nitridation process 370 to implant nitrogen into the epi-liners 330 and 340, the formation of the liner layer 400, and then the nitridation process 540 to implant nitrogen into the liner layer 400. Thereafter, a liner formation process 590 is performed to the IC device 200 to form a liner layer 600 over the liner layer 400. In some embodiments, the liner layer 600 is formed to include silicon nitride, which as discussed above, may offer certain benefits over other types of materials, such as enhanced hydrophobicity and better capability to protect the layers underneath (including the epitaxial semiconductor layer 240) from water or other oxidizing elements. The liner layer 600 may be formed by an atomic layer deposition (ALD) process, so that a thickness 610 of the liner layer 600 can be precisely controlled. In some embodiments, the thickness 610 is formed to be in a range between about 20 nm and about 40 nm. This range of the thickness 610 is not arbitrarily chosen but actually specifically configured to ensure that the liner layer 600 is sufficiently thick to adequately protect the layers underneath from oxidation or other damage, but not too thick to interfere with the subsequent fabrication processing steps. In some embodiments, the thickness 610 is thinner than the thickness 410. For example, a ratio between the thickness 610 and the thickness 410 may be in a range between about 50% and about 200%. Such a ratio range helps the liner layers 600 and 400 serve their respective functions of protecting the components underneath.

Regardless of the embodiment used to implement the STI liners of the present disclosure, it is understood that the other fabrication processes discussed above with reference to FIG. 7 will still need to be performed, such as the formation of the STI structures 450, the removal of the dielectric layers 270 and 280, and the planarization steps, etc.

It is also understood that additional fabrication processes may be performed to complete the fabrication of the IC device 200. For example, the layers around the NMOS and PMOS fin structures 300 and 310 may be partially etched, so as to expose side surfaces of the upper portions of the NMOS and PMOS fin structures 300 and 310. This may be referred to as a fin recess process. Thereafter, high-k metal gate (HKMG) structures (e.g., such as the HKMG structures 140 of FIG. 1A) may be formed to wrap around the NMOS and PMOS fin structures 300 and 310. The formation of the HKMG structures may include a gate replacement process, in which dummy gate structures (e.g., containing a dummy polysilicon gate electrode and either a dummy gate dielectric or a high-k gate dielectric) are first formed over the NMOS and PMOS fin structures 300 and 310. Source/drain regions may then be defined, and then the dummy gate structures are removed and replaced by the HKMG structures. In some embodiments, if the dummy gate structures include a dummy gate dielectric (e.g., a silicon oxide gate dielectric), then the dummy gate dielectric will be replaced by a high-k gate dielectric layer as a part of the KHMG structures. HKMG structures may each include a high-k gate dielectric and a metal gate electrode. Example materials of the high-k gate dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. In some embodiments, the HKMG structures may include additional layers, such as interfacial layers, capping layers, diffusion/barrier layers, or other applicable layers. Other fabrication processes may also be performed after the formation of the HKMG structures, such as formation of conductive contacts for the source/drain regions and the HKMG structures and a multi-layer interconnect structure containing metal lines and vias. For reasons of simplicity, these additional processes are not discussed in detail herein.

Figure 11:
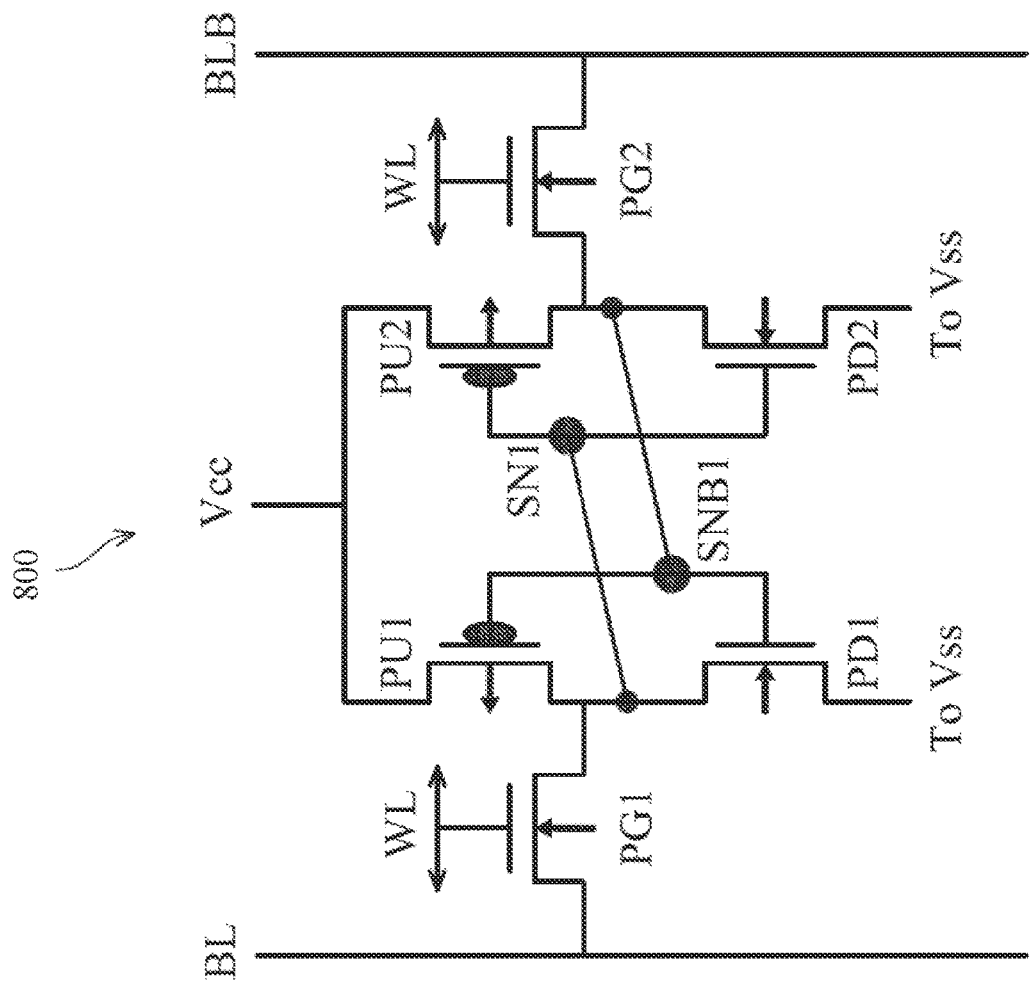
FIG. 11 is a circuit schematic of an SRAM cell according to various aspects of the present disclosure.

The IC device 200 may be implemented in a variety of IC applications, including memory devices such as Static Random-Access Memory (SRAM) devices. In that regard, FIG. 11 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 12 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such as an EUV tool that is used to perform lithography processes to define the various layers of the IC device 200; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 13 is a flowchart illustrating a method 1000 of fabricating a semiconductor device according to embodiments of the present disclosure. The method 1000 includes a step 1010 to form a fin structure that protrudes vertically out of a substrate.

The method 1000 includes a step 1020 to epitaxially grow a silicon layer on surfaces of the fin structure.

The method 1000 includes a step 1030 to perform a first rapid thermal nitridation (RTN) process. The first RTN process implants nitrogen into the epitaxially grown silicon layer.

The method 1000 includes a step 1040 to form a dielectric liner layer over the epitaxially grown silicon layer after the first RTN process has been performed.

The method 1000 includes a step 1050 to form a dielectric isolation structure over the dielectric liner layer.

In some embodiments, fin structure is formed by performing one or more etching processes to pattern the fin structure. The fin structure has a first surface roughness after the performing the one or more etching processes. The silicon layer epitaxially grown on the fin structure has a second surface roughness that is less than the first surface roughness.

In some embodiments, the fin structure is a P-type fin structure that includes a silicon germanium material. In some embodiments, one or more mask layers are formed over the fin structure of the silicon germanium material. The silicon layer is epitaxially grown on both the silicon germanium material and the one or more mask layers. A first portion of the silicon layer grown on the one or more mask layers is thicker than a second portion of the silicon layer grown on the silicon germanium material.

In some embodiments, a silicon oxide liner is formed on the silicon layer after the first RTN process has been performed. An isolation structure is then formed over the silicon oxide liner.

In some embodiments, the forming the dielectric liner layer further includes forming a silicon oxide liner layer on the epitaxially grown silicon layer. The forming the dielectric isolation structure includes forming a shallow trench isolation (STI) structure directly on the silicon oxide liner layer.

In some embodiments, the forming the dielectric liner layer further includes forming a silicon nitride liner layer on the epitaxially grown silicon layer. The forming the dielectric isolation structure includes forming a shallow trench isolation (STI) structure directly on the silicon nitride liner layer.

In some embodiments, the forming the dielectric liner layer further includes forming a silicon oxide liner layer on the epitaxially grown silicon layer. A second RTN process is performed to implant nitrogen into the silicon oxide liner layer. The forming the dielectric isolation structure includes forming a shallow trench isolation (STI) structure directly on the silicon oxide liner layer.

In some embodiments, the forming the dielectric liner layer further includes forming a silicon oxide liner layer on the epitaxially grown silicon layer. In some embodiments, the method further includes: performing a second RTN process to implant nitrogen into the silicon oxide liner layer; and forming a silicon nitride liner layer directly on the silicon oxide liner layer. In some embodiments, the forming the dielectric isolation structure includes forming a shallow trench isolation (STI) structure directly on the silicon nitride liner layer.

In some embodiments, the silicon oxide liner layer is formed to have a first thickness; the silicon nitride liner layer is formed to have a second thickness; and the first thickness is greater than the second thickness.

It is understood that the method 1000 may include further steps performed before, during, or after the steps 1010-1050. For example, the method 1000 may include steps of forming dummy gate structures, formation of source/drain features, replacing the dummy gate structures with high-k metal gate structures, formation of metallization layers, etc. For reasons of simplicity, these additional steps are not discussed herein in detail.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

In summary, the present disclosure forms nitride-containing STI liners over a p-type fully strained channel (PFSC) that contains silicon germanium. In a first embodiment, an epi-liner is formed over the fin structures, which include the PFSC. A rapid thermal nitridation (RTN) process is performed to implant nitrogen into the epi-liner. An oxide-containing STI liner is then formed on the epi-liner. In a second embodiment, the epi-liner is formed over the fin structures that include the PFSC, and the RTN process is performed to implant nitrogen into the epi-liner. Thereafter, a nitride-containing STI liner is formed over the epi-liner. In a third embodiment, the epi-liner is formed over the fin structures that include the PFSC, and the RTN process is performed to implant nitrogen into the epi-liner. Thereafter, the oxide-containing STI liner is formed over the epi-liner, and the nitride-containing STI liner is formed over the oxide-containing STI liner. In a fourth embodiment, the epi-liner is formed over the fin structures that include the PFSC, and a first RTN process is performed to implant nitrogen into the epi-liner. Thereafter, the oxide-containing STI liner is formed over the epi-liner. A second RTN process is then performed to implant nitrogen into the oxide-containing STI liner. The nitride-containing STI liner is then formed over the oxide-containing STI liner.

Forming the STI liners in the manner of the present disclosure may offer advantages over conventional devices. However, it is understood that not all advantages are discussed herein, different embodiments may offer different advantages, and that no particular advantage is required for any embodiment. One advantage is that the damages caused to the PFSC may be mitigated. In more detail, the fin patterning processes and/or oxide layer formation processes may lead to roughened fin surfaces, which could degrade device performance. The nitrogen treatment (e.g., the RTN) of the epi-liners and/or the oxide-containing STI-liners formed thereover helps to smooth over the roughened surfaces and therefore recover the fin surficial damage. In addition, the silicon germanium material of the PFSC oxidizes at a different rate (e.g., substantially faster rate) than the silicon material of the n-type channel. Therefore, the PFSC is more prone or susceptible to environments that contain oxygen (e.g., ambient air or water) than the n-type channel. To better protect the PFSC from the future fabrication steps that may introduce oxygen, the present disclosure forms the nitride-containing STI liners on the PFSC, since the nitride-containing STI liners are better candidates than oxide-containing liners in protecting the PFSC. For example, the nitride-containing STI liners are more hydrophobic than oxide-containing STI liners. Other advantages may include compatibility with existing fabrication processes (including for both FinFET and GAA processes) and the ease and low cost of implementation.

One aspect of the present disclosure pertains to a method for manufacturing a semiconductor structure. The method includes forming a fin structure that protrudes vertically out of a substrate. The method includes epitaxially growing a silicon layer on surfaces of the fin structure. The method includes performing a first rapid thermal nitridation (RTN) process. The first RTN process implants nitrogen into the epitaxially grown silicon layer. The method includes forming a dielectric liner layer over the epitaxially grown silicon layer after the first RTN process has been performed. The method includes forming a dielectric isolation structure over the dielectric liner layer.

Another aspect of the present disclosure pertains to a method for manufacturing a semiconductor structure. The method includes forming patterning a silicon germanium material into a p-type fin structure. The patterning includes one or more etching processes. The method includes growing an epi-layer on the p-type fin structure. The method includes implanting nitrogen into the epi-layer. The method includes depositing a silicon oxide liner layer on the epi-layer after nitrogen has been implanted into the epi-layer. The method includes implanting nitrogen into the silicon oxide liner layer. The method includes forming a shallow trench isolation (STI) structure over the silicon oxide liner layer after nitrogen has been implanted into the silicon oxide liner layer Yet another aspect of the present disclosure pertains to a semiconductor device. The semiconductor device includes a fin structure that protrudes vertically out of a substrate, wherein the fin structure contains silicon germanium (SiGe). An epi-silicon layer is disposed on a sidewall of the fin structure. The epi-silicon layer contains nitrogen. One or more dielectric liner layers are disposed on the epi-silicon layer. A dielectric isolation structure is disposed over the one or more dielectric liner layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a fin structure that protrudes vertically out of a substrate, wherein the fin structure includes a first segment and a second segment different from, and disposed below, the first segment;
   epitaxially growing a silicon layer on surfaces of the fin structure, wherein a first portion of the silicon layer grown on the first segment is thicker than a second portion of the silicon layer grown on the second segment;
   performing a first rapid thermal nitridation (RTN) process, wherein the first RTN process implants nitrogen into the epitaxially grown silicon layer;
   forming a dielectric liner layer over the epitaxially grown silicon layer after the first RTN process has been performed; and
   forming a dielectric isolation structure over the dielectric liner layer.

2. The method of claim 1, wherein:
   the forming the fin structure includes performing one or more etching processes to pattern the fin structure, wherein the fin structure has a first surface roughness after the performing the one or more etching processes; and
   the silicon layer that is epitaxially grown on the fin structure has a second surface roughness that is less than the first surface roughness.

3. The method of claim 1, wherein the forming the fin structure includes forming a P-type fin structure that includes a silicon germanium material.

4. The method of claim 3, wherein:
   the first segment of the fin structure includes one or more mask layers, and wherein the second segment of the fin structure includes the silicon germanium material;
   the first portion of the silicon layer is epitaxially grown on the one or more mask layers; and
   the second portion of the silicon layer is epitaxially grown on the silicon germanium material.

5. The method of claim 1, further including:
   forming a silicon oxide liner on the silicon layer after the first RTN process has been performed; and
   forming an isolation structure over the silicon oxide liner.

6. The method of claim 1, wherein:
   the forming the dielectric liner layer further includes forming a silicon oxide liner layer on the epitaxially grown silicon layer; and
   the forming the dielectric isolation structure includes forming a shallow trench isolation (STI) structure directly on the silicon oxide liner layer.

7. The method of claim 1, wherein:
   the forming the dielectric liner layer further includes forming a silicon nitride liner layer on the epitaxially grown silicon layer; and
   the forming the dielectric isolation structure includes forming a shallow trench isolation (STI) structure directly on the silicon nitride liner layer.

8. The method of claim 1, wherein:
   the forming the dielectric liner layer further includes forming a silicon oxide liner layer on the epitaxially grown silicon layer;
   the method further includes performing a second RTN process to implant nitrogen into the silicon oxide liner layer; and
   the forming the dielectric isolation structure includes forming a shallow trench isolation (STI) structure directly on the silicon oxide liner layer.

9. The method of claim 1, wherein:

the forming the dielectric liner layer further includes forming a silicon oxide liner layer on the epitaxially grown silicon layer;

the method further includes:

performing a second RTN process to implant nitrogen into the silicon oxide liner layer; and forming a silicon nitride liner layer directly on the silicon oxide liner layer; and the forming the dielectric isolation structure includes forming a shallow trench isolation (STI) structure directly on the silicon nitride liner layer.

10. The method of claim 9, wherein:

the silicon oxide liner layer is formed to have a first thickness;

the silicon nitride liner layer is formed to have a second thickness; and the first thickness is greater than the second thickness.

11. A method for manufacturing a semiconductor structure, comprising:

patterning a silicon germanium material into a p-type fin structure, wherein the patterning includes one or more etching processes performed while using a mask structure formed over the silicon germanium material;

growing a first portion of an epi-layer on the patterned silicon germanium material and growing a second portion of the epi-layer over the mask structure, wherein the first portion of the epi-layer is grown to be thinner than the second portion of the epi-layer, and wherein the second portion of the epi-layer is located above the first portion of the epi-layer;

implanting nitrogen into the epi-layer;

depositing a silicon oxide liner layer on the epi-layer after nitrogen has been implanted into the epi-layer;

implanting nitrogen into the silicon oxide liner layer; and forming a shallow trench isolation (STI) structure over the silicon oxide liner layer after nitrogen has been implanted into the silicon oxide liner layer.

12. The method of claim 11, further including, after the implanting the nitrogen into the silicon oxide liner layer but before the forming of the STI structure, depositing a silicon nitride liner layer on the silicon oxide liner layer, wherein the STI structure is formed over the silicon nitride liner layer.

13. The method of claim 12, wherein the silicon nitride liner layer is formed to be thinner than the silicon oxide liner layer.

14. The method of claim 11, wherein:

the implanting the nitrogen into the epi-layer includes performing a first thermal nitridation process; and the implanting the nitrogen into the silicon oxide liner layer includes performing a second thermal nitridation process.

15. The method of claim 11, wherein the depositing a silicon oxide liner layer is performed using a plasma enhanced oxidation process.

16. A method for manufacturing a semiconductor structure, comprising:

forming a silicon layer over a first P-type fin structure and over a second P-type fin structure that each protrude vertically out of a substrate, wherein first portions of the silicon layer formed over upper segments of the first P-type fin structure and the second P-type fin structure are thicker than second portions of the silicon layer formed over lower segments of the first P-type fin structure and the second P-type fin structure;

introducing nitrogen into the silicon layer;

after the nitrogen has been introduced to the silicon layer, forming a dielectric layer over the silicon layer; and forming a dielectric isolation structure between the first P-type fin structure and the second P-type fin structure, wherein the dielectric isolation structure is formed over the dielectric layer.

17. The method of claim 16, wherein a surface of the silicon layer is smoother than a surface of the first P-type fin structure or a surface of the second P-type fin structure.

18. The method of claim 16, wherein the nitrogen is implanted into the silicon layer via a nitridation process having a process temperature in a range between about 600 degrees Celsius and about 800 degrees Celsius and a process duration in a range between about 30 seconds and about 180 seconds.

19. The method of claim 16, wherein the dielectric layer is formed in a processing chamber where hydrogen and oxygen are introduced, and wherein a temperature of the substrate is sufficiently high to initiate a conversion of the hydrogen and the oxygen into water.

20. The method of claim 16, wherein the forming the silicon layer is performed such that the silicon layer contains both crystal silicon and amorphous silicon.

* * * * *